United States Patent [19]

Wetherbee

[11] 4,020,413

[45] Apr. 26, 1977

[54] EMERGENCY AUTO IGNITION KIT AND SPARK PLUG TESTER

[75] Inventor: Edward P. Wetherbee, Brighton, Mich.

[73] Assignee: The Raymond Lee Organization, Inc., New York, N.Y. ; a part interest

[22] Filed: Nov. 17, 1975

[21] Appl. No.: 632,444

[52] U.S. Cl. .............................................. 324/15
[51] Int. Cl.[2] ........................................ G01R 13/42
[58] Field of Search .................... 324/15, 17, 16, 18

[56] References Cited

UNITED STATES PATENTS

| | | | |
|---|---|---|---|
| 2,501,802 | 3/1950 | Walker | 324/17 |
| 3,551,800 | 12/1970 | Widmer | 324/15 |

FOREIGN PATENTS OR APPLICATIONS

| | | | |
|---|---|---|---|
| 212,702 | 3/1924 | United Kingdom | 324/15 |

*Primary Examiner*—Stanley T. Krawczewicz
*Attorney, Agent, or Firm*—Howard I. Podell

[57] ABSTRACT

A device for alternate use as an emergency replacement coil and condenser unit or as a tester of automobile spark plugs. The unit is in the form of an enclosed housing in which an automobile ignition coil and condenser are mounted in parallel to the low voltage coil terminals. A momentary normally closed push button switch is mounted in a housing wall and connected in series with one of a pair of low tension lead wires extending from the housing, with the lead wires connected in parallel to the coil and condenser. The high tension outlet connection of the coil is mounted adjacent a hole in the housing for insertion of the coil terminal of cable of an engine leading to the high tension connection of the distributor cap, when the low tension lead wires are connected across the low tension terminals of a defective engine ignition coil to substitute the device for the engine coil. Alternately, the low tension leads of the device may be connected directly to a battery and a spark plug connected by a portable cable and a ground connection cable to the device, with operation of the momentary control switch causing a spark across the spark points of a normal spark plug.

1 Claim, 2 Drawing Figures

EMERGENCY AUTO IGNITION KIT AND SPARK PLUG TESTER

SUMMARY OF THE INVENTION

My invention is a device for alternate use as an emergency replacement coil and condenser unit or as a tester of automobile spark plugs. The unit is in the form of an enclosed housing in which an automobile ignition coil and condenser are mounted in parallel to the low voltage coil terminals. A momentary normally closed push button switch is mounted in a housing wall and connected in series with one of a pair of low tension lead wires extending from the housing, with the lead wires connected in parallel to the coil and condenser. The high tension outlet connection of the coil is mounted adjacent a hole in the housing for insertion of the coil terminal of cable of an engine leading to the high tension connection of the distributor cap, when the low tension lead wires are connected across the low tension terminals of a defective engine ignition coil to substitute the device for the engine coil. Alternately, the low tension leads of the device may be connected directly to a battery and a spark plug connected by a portable cable and a ground connection cable to the device, with operation of the momentary control switch causing a spark across the spark points of a normal spark plug.

BRIEF DESCRIPTION OF THE DRAWINGS

The objects and features of the invention may be understood with reference to the following detailed description of an illustrative embodiment of the invention, taken together with the accompanying drawings in which.

DESCRIPTION OF THE PREFERRED EMBODIMENT

Figure 1:
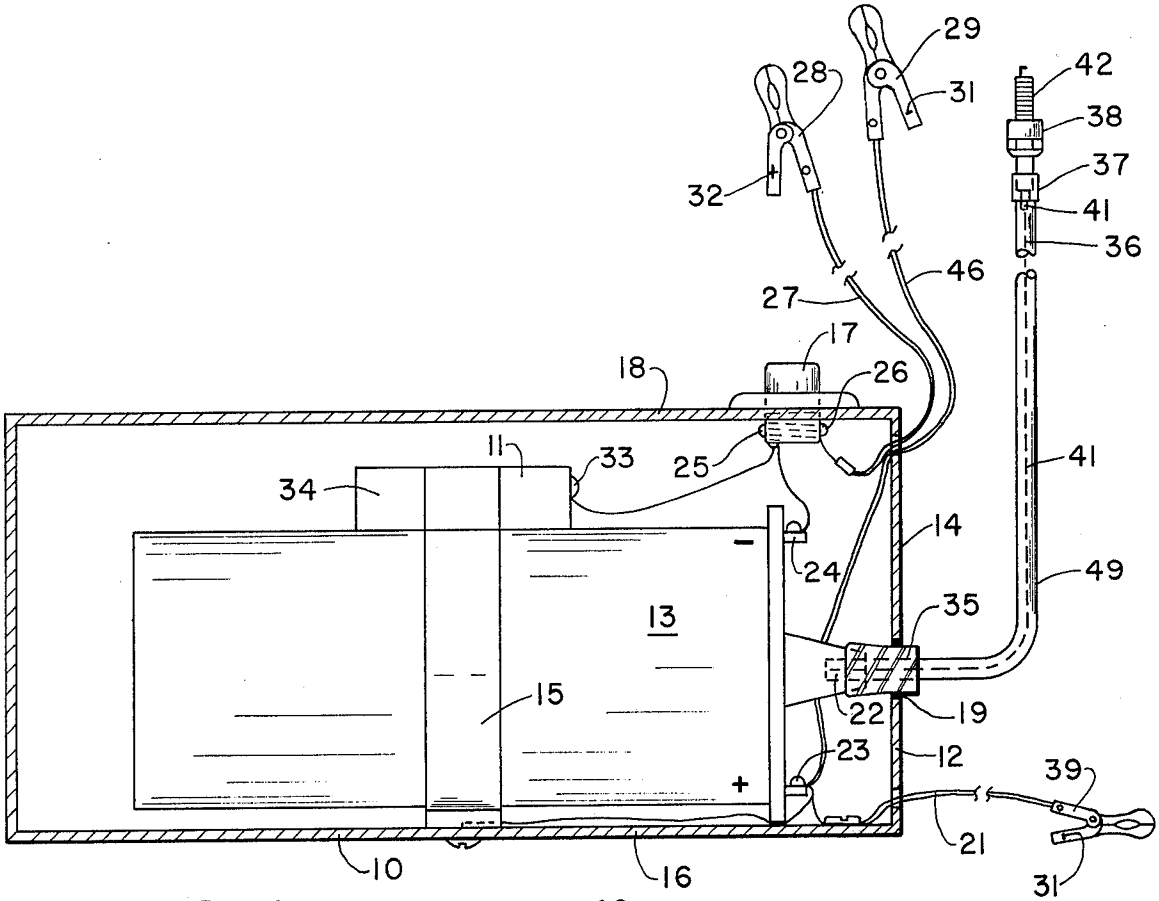
FIG. 1 is a sectional view of the invention.
Figure 2:
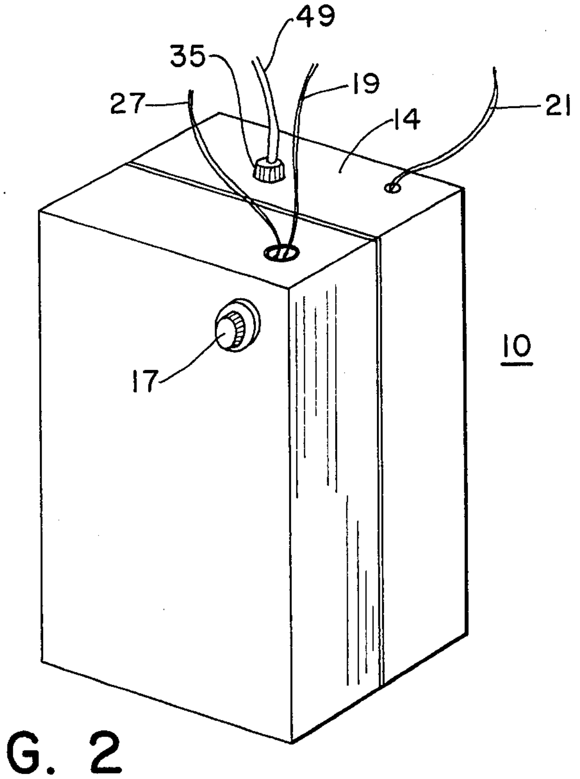
FIG. 2 is a perspective view of the invention.

Turning now descriptively to the drawings, in which similar reference characters denote similar elements throughout the several views, FIGS. 1 and 2 illustrate the device 10 which comprises an enclosed housing 12 in which an automotive ignition coil 13 and a metal clad condenser 11 are fastened by a metal clamp 15 to a wall 16 of the housing. A momentary contact normally closed push button switch 17 is mounted to a housing wall 18. A hole 19 in a housing wall 14 is fitted with an insulated sleeve 35 through which an insulated high tension cable 49 may be fitted to connect to the high tension terminal 22 of coil 13.

The positive low tension terminal 23 of coil 13 is connected to a flexible insulated wire 46 that extends through housing wall 14 and terminates in a clamp 29 which is marked with a minus sign 31. A similar clamp 28 marked with a plus sign 32 is connected by a flexible insulated wire 27 to a first terminal 26 of switch 17, with the second terminal 25 of switch 17 connected to the minus low tension terminal 24 of coil 13 and a terminal 33 of condenser 11. The other terminal of condenser 11 is the metal clad body 34 which is connected by metal clamp 15 and wire 16 to the plus low tension terminal 23 of coil 13, and to a flexible wire 21 extending through housing wall 13 to a clamp 39 marked with a minus insignia 31.

The device 10 may be substituted for a defective coil of an engine (not shown) by connecting clamps 28 and 29 to the respective low tension terminals of the defective coil and removing the high tension cable of the engine from the defective coil and placing it in sleeve 35 to contact the high tension terminal 22 of coil 13.

Alternately, for testing of spark plugs clamps 28 and 29 are attached to the respective terminals of a battery or the low tension terminals of an automobile engine coil connected in the normal fashion to a battery, with cable 49 fastened through sleeve 35 to contact high tension terminal 22 of coil 13. Cable 49 is fitted at its extended end 36 with a sleeve 37 that grips the body of a spark plug 38 so as to bring the spark plug terminal 41 in contact with the conductor 41 of cable 49. The metal section 42 of spark plug 38 is gripped by clamp 39 and push button switch 17 is momentarily opened to produce a spark across the spark terminals of the spark plug 38 if it is in normal operating condition.

Since obvious changes may be made in the specific embodiment of the invention described herein, such modifications being within the spirit and scope of the invention claimed, it is indicated that all matter contained herein is intended as illustrative and not as limiting in scope.

Having thus described the invention, what I claim as new and desire to secure by Letters Patent of the United States is:

1. A device which alternately serves for emergency use as a replacement engine ignition coil or as a spark plug tester, comprising a housing enclosing a condensor and an ignition coil, with a sleeve extending through the housing located adjacent the high tension terminal of the said ignition coil, with a first and a second flexible insulated wire each externally attached to an individual clamp and each wire extending into the housing and connected to both a first low tension lead of the said ignition coil and to a first terminal of the said condenser, together with a third flexible insulated wire externally attached to a clamp and extending into the housing and connected to a first terminal of a normally closed momentary contact switch mounted in a housing wall, said switch connected through its second terminal to the second terminals respectively of both the coil and condenser, together with a length of flexible high tension insulated ignition cable, one end of which is fastened to a sleeve of a size to fit over a body of a spark plug and the other end of which is shaped to attach to the conductor of the coil when fitted through the sleeve in the housing, so that when a sparkplug is attached in the sleeve of the ignition cable, the conductor of the ignition wire is in contact with the terminal of the sparkplug.

* * * * *